(12) United States Patent
Lu et al.

(10) Patent No.: US 6,670,646 B2
(45) Date of Patent: Dec. 30, 2003

(54) MASK AND METHOD FOR PATTERNING A SEMICONDUCTOR WAFER

(75) Inventors: Zhijian Lu, Poughkeepsie, NY (US); Shahid Butt, Ossining, NY (US); Alois Gutmann, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/074,479

(22) Filed: Feb. 11, 2002

(65) Prior Publication Data

US 2003/0153126 A1 Aug. 14, 2003

(51) Int. Cl.⁷ .............................................. H01L 33/00
(52) U.S. Cl. ........................................ 257/98; 257/91
(58) Field of Search .............................. 257/91, 98, 79, 257/88, 296, 396

(56) References Cited

U.S. PATENT DOCUMENTS

| | | |
|---|---|---|
| 5,242,770 A | 9/1993 | Chen et al. |
| 5,256,505 A | 10/1993 | Chen et al. |
| 5,316,896 A | 5/1994 | Fukuda et al. |
| 5,397,663 A | 3/1995 | Uesawa et al. |
| 5,416,722 A | 5/1995 | Edwards |
| 5,447,810 A | 9/1995 | Chen et al. |
| 5,468,578 A | 11/1995 | Rolfson |
| 5,472,814 A | 12/1995 | Lin |
| 5,536,604 A | 7/1996 | Ito |
| 5,663,893 A | 9/1997 | Wampler et al. |
| 5,702,848 A * | 12/1997 | Spence ........................ 430/5 |
| 5,707,765 A | 1/1998 | Chen |
| 5,723,233 A | 3/1998 | Garza et al. |
| 5,740,068 A | 4/1998 | Liebmann et al. |
| 5,766,806 A * | 6/1998 | Spence ........................ 430/5 |
| 5,786,115 A | 7/1998 | Kawabata et al. |
| 5,789,117 A | 8/1998 | Chen |
| 5,821,014 A | 10/1998 | Chen et al. |
| 5,827,623 A | 10/1998 | Ishida et al. |
| 5,851,702 A | 12/1998 | Watanabe et al. |
| 5,862,058 A | 1/1999 | Samuels et al. |
| 5,885,735 A | 3/1999 | Imai et al. |
| 5,900,338 A | 5/1999 | Garza et al. |
| 5,900,340 A | 5/1999 | Reich et al. |
| 5,920,487 A | 7/1999 | Reich et al. |
| 6,004,699 A | 12/1999 | Yasuzato et al. |
| 6,077,310 A | 6/2000 | Yamamoto et al. |
| 6,078,372 A * | 6/2000 | Kim ........................ 349/106 |
| 6,127,071 A | 10/2000 | Lu |
| 6,136,478 A | 10/2000 | Usui et al. |
| 6,178,360 B1 | 1/2001 | Pierrat et al. |
| 6,194,104 B1 | 2/2001 | Hsu |
| 6,218,057 B1 | 4/2001 | Cirelli et al. |
| 6,269,472 B1 | 7/2001 | Garza et al. |
| 6,282,696 B1 | 8/2001 | Garza et al. |
| 6,323,920 B1 * | 11/2001 | Kim ........................ 349/106 |
| 6,421,820 B1 | 7/2002 | Mansfield et al. |
| 6,453,457 B1 * | 9/2002 | Pierrat et al. ................ 716/19 |

* cited by examiner

*Primary Examiner*—David Nhu
(74) *Attorney, Agent, or Firm*—Slater & Matsil, L.L.P.

(57) ABSTRACT

A mask (118) and method for patterning a semiconductor wafer. The mask (118) includes apertures (122) and assist lines (124) disposed between apertures (122). The assist lines (124) reduce the diffraction effects of the lithographic process, resulting in improved depth of focus and resolution of patterns on a semiconductor wafer.

15 Claims, 4 Drawing Sheets

MASK AND METHOD FOR PATTERNING A SEMICONDUCTOR WAFER

TECHNICAL FIELD

The present invention relates generally to the fabrication of semiconductor devices, and more particularly to a patterning mask and method.

BACKGROUND OF THE INVENTION

Semiconductors are widely used for integrated circuits for electronic applications, including radios, televisions, cellular phones, and personal computing devices, as examples. Such integrated circuits (IC's) typically include multiple transistors fabricated in single crystal silicon. It is common for there to be millions of semiconductor devices on a single semiconductor product. Many integrated circuits now include multiple levels of metallization for interconnections.

Semiconductor device fabrication involves depositing or forming metallization, dielectric, and active component layers, as examples, on a semiconductor wafer. Each layer must be patterned with a desired pattern in order for the semiconductor devices to function properly. A patterning process typically involves depositing a photoresist that may comprise an organic polymer, for example, over a semiconductor wafer layer. The photoresist is exposed through a mask to transfer the pattern of the mask to the photoresist. Either exposed or unexposed portions of the photoresist are removed during subsequent development processes, depending on whether a positive or negative lithographic resist process is used. The photoresist portions remaining on the semiconductor wafer surface shield the top wafer surface during an etch process to leave the top semiconductor wafer layer residing in regions where photoresist remain.

A prior art apparatus 10 for patterning the surface of a semiconductor wafer 30 is shown in FIG. 1. A stage 12 is adapted to support a semiconductor wafer 30. The stage 12 may be adapted to move the entire wafer 30 from position to position in order to expose portions of the wafer 30 surface during the patterning process. The stage 12 may be mounted on a base, not shown. The stage 12 is adapted to securely hold the wafer 30 in place. A lens 20 is disposed above the wafer 30. Lens 20 typically comprises a demagnification lens that reduces the image transferred to the wafer 30 by 4–5x, for example. Alternatively, no lens 20 may be required if a 1:1 ratio magnification scheme is used for transferring the pattern from the mask 18 to the wafer 30. A mask 18 having the desired pattern to be transferred to the wafer 30 is disposed above lens 20. A light or energy source 16 is disposed above mask 18, as shown.

To pattern the wafer 30, the light source 16 which may comprise a laser or ultraviolet light, for example, is illuminated. The light passes through the mask 18, through demagnification lens 20, and exposes portions of the top surface of the semiconductor wafer 30.

There are various types of exposure tools that function similarly to the apparatus 10 described and illustrated in FIG. 1. In a step and repeat apparatus, the mask 18 pattern is transferred onto a section of the wafer 30 at a time, and a stage 12 moves the wafer 30 from point to point, exposing the wafer 30 surface in a plurality of steps. An alternative apparatus used to pattern and expose a wafer 30 surface is known as a step and scan apparatus, for example.

FIG. 2 illustrates a top view of a mask 18 having a pattern including transparent regions, holes or apertures 22 therein. A portion of a wafer 30 top surface is also shown, having much smaller dimensions than the mask 18 due to demagnification. Wafer regions 26 represent exposed (or unexposed) patterned portions of the semiconductor wafer 30 surface after patterning the wafer 30 using the mask 18.

The pattern shown in FIG. 2 may represent a pattern for deep trenches used in memory cells of semiconductor devices, for example. Deep trench printing is a challenge for lithographers due to limited process latitude and resolution of prior art apparatuses and methods. Due to practical process window constraints, it is difficult to further reduce the current deep trench critical dimension (CD) targets.

Another problem with prior art lithography masks and processes is that a larger mask 18 is typically used than the desired pattern on a wafer 30. Due to resolution and diffraction of the light through the mask 18, the pattern transferred to the wafer 30 is distorted, and therefore a greater than one-to-one ratio is used to transfer the desired image or pattern. However, it is desirable in the art to have a one-to-one relationship between the pattern on the mask 18 and the pattern on the wafer 30, which would require no demagnification in the lens 20.

Furthermore, a transfer problem referred to as line shortening may occur when the mask 18 pattern is transferred to the semiconductor wafer 30 surface. Line shortening is typically more problematic for small feature sizes; for example, the length L of FIG. 2 design target may be difficult to achieve because of line shortening.

Some prior art methods for improving lithography of patterns with narrow geometries include dense optical proximity correction (OPC) and phase shift masks (PSM). OPC helps compensate for lost light to ensure that the precise patterns are formed on a semiconductor wafer. For example, without OPC, a rectangle produces a pattern on a semiconductor wafer that appears oval because light tends to round on the edges. OPC is used to correct this phenomenon by adding tiny serifs, or lines, to the corners to ensure that the corners are not rounded, or moving a feature edge so wafer features are sized more accurately. Phase shift masks alter the phase of light passing through the photomask, and permit improved depth of focus and resolution on the wafer. Phase shifting helps reduce the distortion of line resolution of wafer surface irregularities.

What is needed in the art is a semiconductor wafer patterning mask and method that alleviates mask demagnification requirements and line shortening problems found in prior art methods and masks.

SUMMARY OF THE INVENTION

Embodiments of the present invention achieve technical advantages as a method and apparatus for patterning the surface of a semiconductor wafer.

Disclosed is a method of manufacturing a semiconductor wafer patterning mask, the method comprising providing a transparent substrate, forming an opaque material over the substrate, and forming a pattern in the opaque material, where the pattern includes a plurality of apertures and an assist line positioned between at least two of the apertures.

Also disclosed is a semiconductor wafer patterning mask, comprising a transparent substrate, and an opaque material disposed over the substrate, the opaque material comprising a pattern including a plurality of apertures, wherein an assist line is coupled between at least two of the apertures.

Further disclosed is a semiconductor device patterned with a semiconductor wafer patterning mask, comprising a transparent substrate, and an opaque material disposed over the substrate, the opaque material comprising a pattern including a plurality of apertures, wherein an assist line is coupled between at least two of the apertures.

Advantages of the embodiments of the invention include increased depth of focus (DOF) and increased exposure latitude. Resolution is enhanced, and line shortening is reduced. Furthermore, printing elliptical deep trenches is achievable in accordance with embodiments of the present invention. Smaller deep trench critical dimensions are made possible with the use of assist lines. The need for a bias or demagnification of the mask pattern with respect to the wafer may be eliminated. The need for a test mask may also be eliminated in accordance with embodiments of the present invention.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Some preferred embodiments of the present invention will be described, followed by a discussion of some advantages of embodiments of the present invention.

Figure 1:
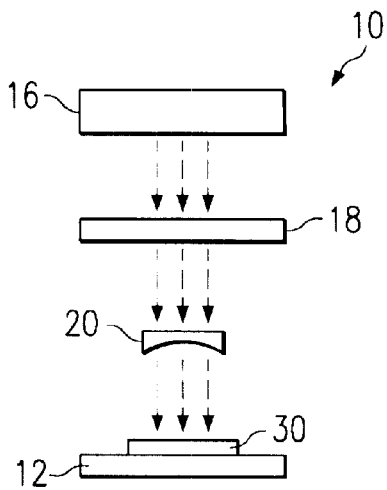
FIG. 1 illustrates a prior art patterning apparatus.
Figure 2:
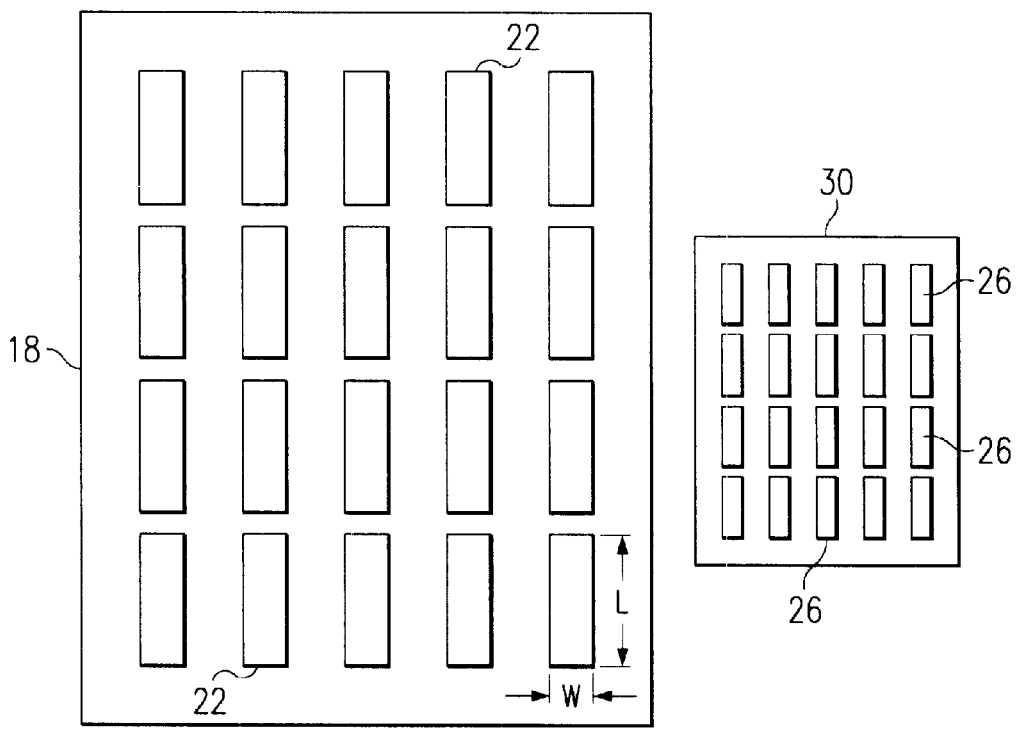
FIG. 2 shows a prior art mask and a semiconductor wafer surface patterned by the mask.
Figure 3:
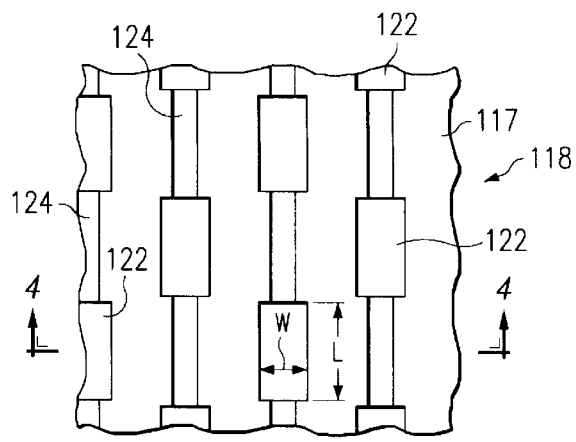
FIG. 3 illustrates a top view of a mask in accordance with an embodiment of the present invention having assist lines in the vertical direction between deep trench patterns.

FIG. 3 illustrates a top view of a mask or reticle 118 in accordance with a preferred embodiment of the present invention. Mask 118 includes transparent regions or apertures 122 that comprise patterns, for example, rectangles for patterning deep trenches. In accordance with an embodiment of the invention, assist lines 124 are included in the pattern that run vertically between the short sides of at least two adjacent rectangles 122. Assist lines 124 are designed to comprise a dimension that improves the image transferred to a semiconductor wafer. For 175 nm ground rule deep trenches, assist lines 124 are preferably between about 50 nm and 125 nm wide, as an example.

Figure 4:
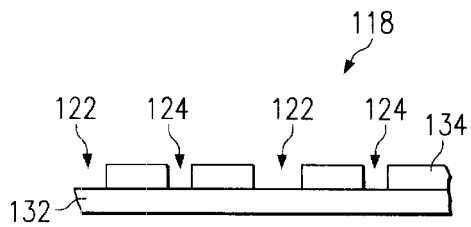
FIG. 4 shows a cross-sectional view of the mask in FIG. 3.

FIG. 4 illustrates the mask 118 in a cross-sectional view at 4—4 of FIG. 3. A substrate 132 is provided. The substrate 132 preferably comprises quartz, and may alternatively comprise other transparent materials, for example. An opaque material 134 is formed over the transparent material 132. The opaque material 134 preferably comprises a metal such as chrome, and may alternatively comprise other energy-absorbent materials that may be patterned in order to produce a mask that may be used to pattern a semiconductor wafer. The substrate 132 comprising a transparent material preferably comprises a substantially homogeneous thickness. Apertures 122 are represented by larger regions 122 and assist lines 124 are represented by smaller spaces between undisturbed regions of the opaque material 134.

In accordance with an embodiment of the present invention, a pattern is formed on the opaque material 134 of the mask 118. To form the pattern, a resist is typically deposited on the mask 118, and a source generates an energy beam (not shown) that is focused and shaped by a lens system (not shown) that directs the beam onto the mask to expose the resist in a predetermined pattern. The energy beam may comprise a laser or electron beam, for example. Krypton fluoride (KrF) lithography may be used, e.g., a 248 nm excimer laser.

The mask pattern includes apertures 122 preferably having substantially the same dimension as the dimension desired to be patterned on a semiconductor wafer, in a 1:1 ratio, for example. Advantageously, in accordance with embodiments of the present invention, assist lines 124 are also patterned on the opaque material 134 of the mask 118. Assist lines 124 preferably run vertically on the mask 118 between the short edges of two adjacent apertures 122, the assist lines 124 abutting the edge of adjacent apertures 122.

In DRAM deep trench photolithography, typically, a deep trench will have a narrower width W than length L, with the length running in a vertical direction, as shown in FIG. 3. In accordance with an embodiment of the present invention, preferably, assist lines 124 run in the same direction as the longer side L of rectangular shaped apertures 122, e.g. the aperture length L, vertically. This is advantageous because line shortening is more of a problem in the width W dimension direction, or on the shorter of the two sides of the rectangular apertures 122.

The opaque material 134 pattern may include a plurality of apertures 122 arranged in an array of rows and columns, wherein the pattern includes a plurality of assist lines 124 disposed between and abutting adjacent apertures 122 in at least one of the columns, as shown in FIG. 3. For example, a first aperture 122 may reside in a first row and a second aperture 122 may reside in a second row, the second row being adjacent to the first row, wherein the assist line 124 has a length equal to the distance between the first aperture and the second aperture. The assist lines 124 may have a width equal to approximately 30 to 75% of the minimum feature size of a feature on a semiconductor wafer, for example.

Figure 5:
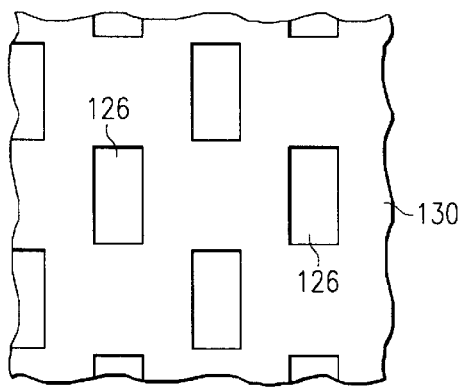
FIG. 5 shows a top view of a semiconductor wafer patterned by the mask shown in FIGS. 3 and 4.

FIG. 5 illustrates a top view of a semiconductor wafer 130 that is patterned using the mask 118 shown in FIGS. 3 and 4. Semiconductor wafer 130 which has been previously coated with a resist, for example, is exposed to energy, e.g., ultraviolet light, to expose portions of the resist on the wafer 130 and produce patterned regions 126 corresponding to the apertures 122 of the mask 118. Advantageously, the assist lines 124 of the mask 118 produce an improved resolution of the patterned regions 126 on the wafer 130. Preferably, in accordance with embodiments of the present invention, a 1:1 ratio is used, e.g., the mask 118 apertures 122 are substantially the same size as the semiconductor wafer 130 features 126. The patterned regions 126 may be more elliptical or rounded than the rectangular shapes shown.

Figure 6:
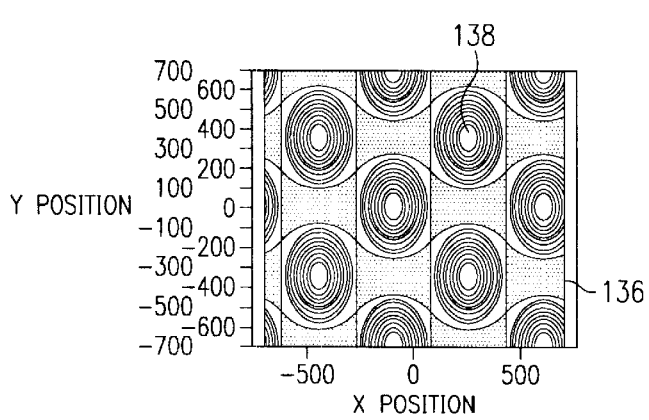
FIG. 6 illustrates an aerial image of a deep trench pattern showing the relative intensity of light transferred through the mask shown in FIG. 3.

FIG. 6 illustrates an aerial image of a deep trench pattern on a wafer 130 produced by lithography mask 118 in accordance with an embodiment of the present invention. The aerial image represents the relative intensity of the x position versus y position on the wafer 118. The various shades of contrast illustrate that less light is transferred to the wafer 130 in regions 136 that are covered by opaque regions 134 of the mask 118, and contrast areas 138 receive the brightest areas of light through the mask 118 at the center regions of the apertures 122. For example, regions 136 of the wafer 130 may receive 5.5 percent of light as it passes through the mask 118, whereas central regions 138 of the deep trench patterns 122 may receive 28.2 percent of light as it passes through the mask 118. Note that 100 percent of the light is not passed through the mask 118 in the center 138 of the apertures because of the diffraction and diffusion effects of patterning such small dimensions, which may be micron or sub-micron in size. The contrast images shown in FIG. 6 illustrate the improvement over prior art relative intensity aerial mask images, due to the advantageous use of the assist lines 124, in accordance with embodiments of the present invention. Prior art masks achieve a maximum contrast of around 25 or 26.

Figure 7:
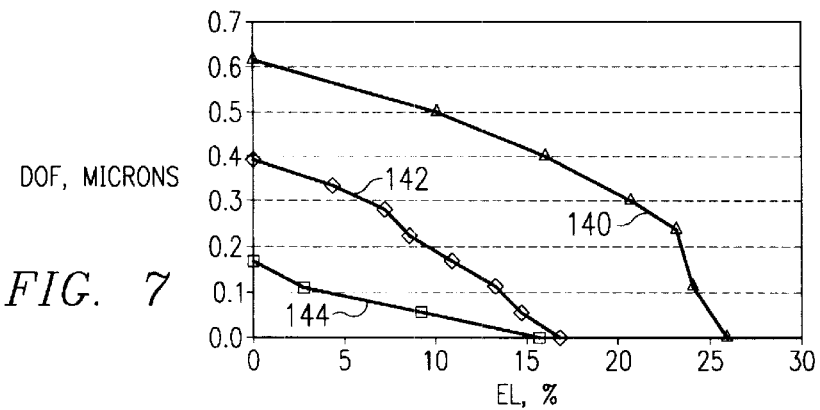
FIG. 7 shows a process window represented by the relationship of the depth of focus to exposure latitude with and without assist lines.

FIG. 7 illustrates a graphical depiction of the improved "process window" achievable by the use of embodiments of the present invention. The "process window" refers to the amount of area beneath each curve 140, 142 and 144 shown. The line at 144 illustrates the depth of focus (DOF) with respect to exposure latitude of a mask having no bias and no assist lines, for example, having 175 nm width and 350 nm length rectangular apertures. Line 142 illustrates graphically the relationship of the depth of focus to exposure latitude of a mask having bias and no assist lines and rectangular apertures having dimensions of 200 nm width and 450 nm length. The line at 140 illustrates graphically the results of an embodiment of the present invention having no bias and using the assist lines 124 unique in the present invention. Advantageously, the process window for line 140 is significantly greater than prior art lines 142 and 144, as shown.

Figure 8:
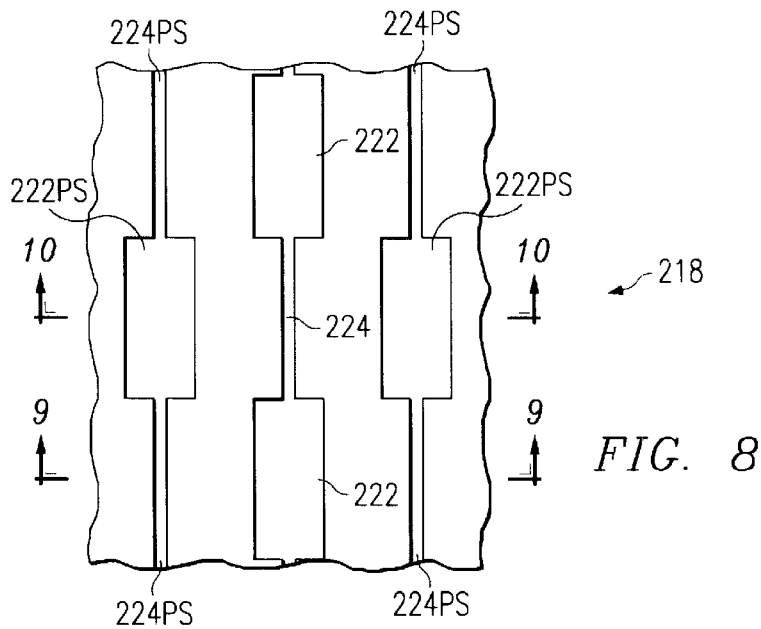
FIG. 8 illustrates another embodiment of the present invention, showing a top view of a mask having assist lines between deep trench patterns in the vertical direction, with every other column being 180 degrees out of phase.

An alternative embodiment of the present invention utilizing an alternating phase shift mask is shown in FIGS. 8 through 12. FIG. 8 illustrates a top view of a mask 218 having apertures 222/222PS and assist lines 224/224PS formed in an opaque material 234. In this embodiment, the substrate 232 of every other vertical column of the mask 218 is phase shifted 180 degrees from the adjacent column. For example, in the left side of FIG. 8, the aperture 222PS and assist lines 224PS are phase shifted 180 degrees from the adjacent apertures 222 and the assist lines 224 to the right thereof. The phase shifting can be more clearly seen by viewing FIG. 9, which is a cross-sectional view of the mask 218 at view 9—9.

Figure 9:
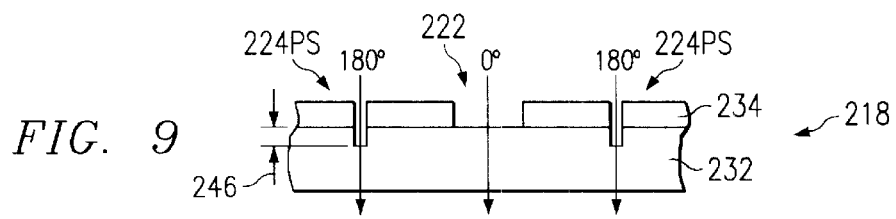
FIGS. 9 and 10 show cross-sectional views of the mask shown in FIG. 8.

In FIG. 9, the phase shifted regions are shown as being achieved by having a reduced thickness 246 of the substrate, which decreased thickness produces a 180 degrees phase shift from the thickness of the substrate 232 at the non-phase shifted aperture 222 shown at zero degrees. For example, the distance 246 may be equal to:

Eq. 1:

$$\frac{\lambda}{2(n-1)}$$

where λ is the wavelength of light, and n is the refractive index of the substrate 232 material. Alternatively, the phase shifted regions 222PS and 224PS of the substrate may be phase shifted by another means, for example, a different material may be used for phase shifted regions 222PS/224PS than for non-phase shifted regions 222/224.

Figure 10:
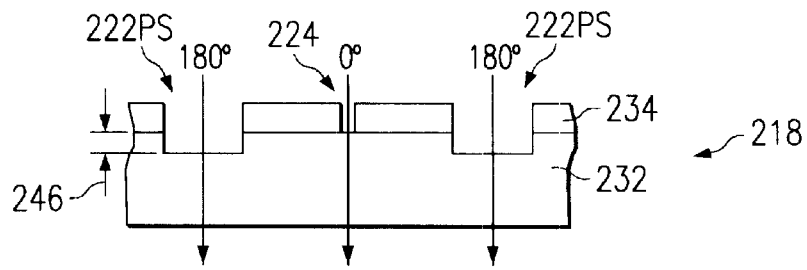

FIG. 10 shows a cross-sectional view of the mask 218 shown in FIG. 8 at view 10—10. Similar to FIG. 9, apertures 222PS are phase shifted 180 degrees and assist line 224 is not phase shifted, as shown.

In accordance wit an embodiment of the invention, shown in FIGS. 8–10, the opaque material 234 pattern includes a plurality of apertures 222 arranged in an array of rows and columns, wherein the pattern includes a plurality of assist lines 224 disposed between and abutting adjacent apertures 222 in at least one of the columns wherein the substrate 232 is phase-shifted in every other column.

In accordance with another embodiment of the invention, shown in FIGS. 8–10, the array of apertures 222 comprises a first row and a second row, wherein the apertures 222 in alternating rows and columns are staggered, wherein a third row resides between the first and second row, wherein at least one of the assist lines 224 is disposed between two adjacent apertures 222 in the third row.

Figure 11:
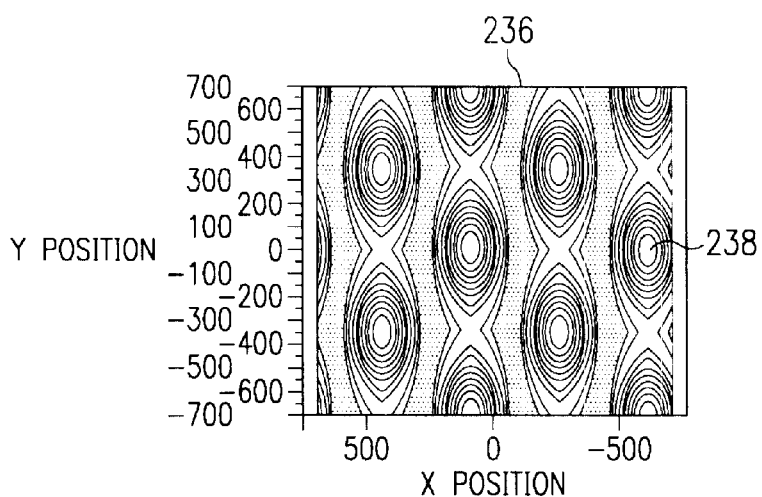
FIG. 11 shows an aerial image of the relative intensity of light transferred through the mask shown in FIG. 8.

FIG. 11 shows an aerial view of the relative light intensity of transferred light through the mask 218. As in FIG. 6, regions 236 represent areas of the wafer 130 receiving the least amount of light through the mask 218, and areas 238 represent areas on the wafer 130 receiving the most amount of light in the center of the trench 222/222PS apertures. For example, regions 236 of the wafer 130 may receive 7.2 percent of light as it passes through the mask 218, whereas central regions 238 of the deep trench patterns 222 may receive 60.0 percent of light as it passes through the mask 218.

The shape of the deep trenches on the wafer 130 may be substantially oval, which is desirable, because deep trenches are often desired to be oval in shape. The assist lines 224/224PS tune the pattern shape to be more elliptical. Therefore, advantageously, embodiments of the present invention are beneficial in that substantially oval deep trenches may be patterned by the use of assist lines. Utilizing alternating phase shift masks may further improve the elliptical shape of the trench patterns.

Figure 12:
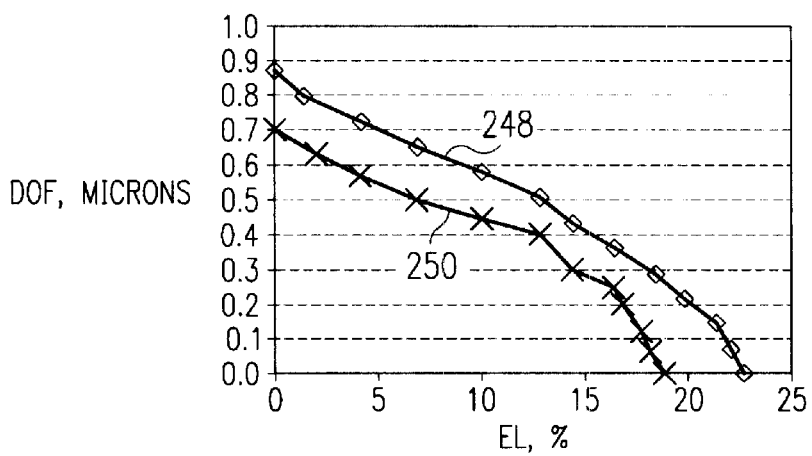
FIG. 12 is a graph depicting the process window demonstrated by the relationship of the depth of focus to the exposure latitude for an embodiment of the present invention compared to prior art masks.

FIG. 12 illustrates the improved process window achievable by the use of the mask 218 utilizing alternating phase shift lines 224/224PS in accordance with an embodiment of the present invention. Line 248 represents an alternating PSM with no mask bias and having 50 nm assist lines between apertures. Line 248 shows the improved process window provided by an embodiment of the present invention shown in FIGS. 8–10 having an increased depth of focus and exposure latitude at each point along the graph. The process window 248 is greater than the process window of a prior art alternating PSM having no bias and with no assist lines, represented by the line at 250.

The embodiments of the present invention shown in FIGS. 8 through 12 utilize phase-shifted assist lines at each end of nominal deep trenches along the long axis. In this way, a semi-isolated contact structure is converted to an uneven line/space structure. Additionally, phase-shifting effects for neighboring nominal deep trenches are enhanced, which results in a better aerial image and a boost in process window and resolution.

Preferably, the assist lines 122/222/222PS of embodiments of the present invention range from 25 nm to 150 nm in width. Furthermore, preferably, an assist line 122/222/222PS is positioned at two sides, e.g., on either side, of a deep trench along a long axis.

Advantages of embodiments of the invention include increasing the lithographic process window and increasing the contrast for the patterning of semiconductor wafers. The deep trench resolution is also improved with the use of assist lines according to embodiments of the present invention. The depth of focus is improved, as well as exposure latitude, resulting in a more than a factor two increase in total process latitude. Embodiments of the invention also improve line shortening and allow the printing of elliptical deep trench patterns. Smaller deep trench critical dimensions are made possible with the use of assist lines, described herein.

Another advantage is the ability to eliminate the need for a bias, or demagnification of the mask 118/218 pattern with respect to the wafer 130. For example, because the resolution and depth of focus is improved, a one-to-one relationship may be used when patterning a wafer 130. For example, the apertures 122/222/222PS may comprise the same dimensions as the patterned regions 126 on a wafer 130. This is advantageous because of the patterning lithography process is simplified, and the need for magnification and demagnification lenses is eliminated in the lithography processing equipment.

Furthermore, having a ratio of other than 1:1 between the mask 118/218 and the wafer 130 requires making a test mask, to optimize bias, which may require several iterations. The need for a test mask is eliminated in accordance with embodiments of the present invention.

While the present patterning process is described herein with reference to a DRAM array, the present process and mask may be utilized in the fabrication of other semiconductor devices such as ferroelectric random access memories (FRAM's), magnetic random access memories (MRAM's), and other semiconductor memory devices, as examples. Semiconductor devices other than memory devices, such as logic devices, as an example, also benefit from the use of embodiments of the present invention. Furthermore, the assist lines described herein are also beneficial in patterning active areas of planar cell technology, for example.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A semiconductor wafer patterning mask, comprising: a transparent substrate; and
   an opaque material disposed over the substrate, the opaque material comprising a pattern including at least a first apertures a second aperture, and an assist line extending between and abutting the first aperture and second aperture.

2. The mask according to claim 1, wherein the first and second apertures comprise rectangles having a length and a width, wherein the rectangle length is greater than the width, wherein the rectangle length is positioned in a vertical direction, wherein the assist line is positioned vertically between a rectangle edge along the width of the first and second apertures.

3. The mask according to claim 1, wherein the opaque material pattern includes a plurality of apertures arranged in an array of rows and columns, wherein the pattern includes a plurality of assist lines disposed between and abutting adjacent apertures in at least one of the columns.

4. The mask according to claim 3, wherein the first aperture resides in a first row and the second aperture resides in a second row, the second row being adjacent to the first row, and wherein the assist line has a length equal to the distance between the first aperture and the second aperture.

5. The mask according to claim 1, wherein the assist line has a width equal to approximately 30 to 75% of the minimum feature size of a feature on a semiconductor wafer.

6. The mask according to claim 1, wherein the substrate compnses quartz, and wherein the opaque material comprises chrome.

7. The mask according to claim 1, further comprising phase shifted regions and non-phase shifted regions on the substrate.

8. The mask according to claim 7, wherein the substrate phase shifted regions have a first thickness and the non-phase shifted regions have a second thickness, wherein the phase shift between the first and second thickness regions is 180 degrees.

9. The mask according to claim 7 wherein the opaque material pattern includes a plurality of apertures arranged in an array of rows and columns, wherein the pattern includes a plurality of assist lines disposed between and abutting adjacent apertures in at least one of the columns, wherein the substrate is phase-shifted in every other column.

10. The mask according to claim 1, wherein the assist line ranges from 25 nm to 150 nm width.

11. A semiconductor device patterned with the mask according to claim 1.

12. The semiconductor device according to claim 11, wherein the device comprises features patterned by the mask apertures, and wherein the mask apertures and device features have a 1:1 dimensional ratio.

13. The semiconductor device according to claim 11, wherein the semiconductor device comprises a dynamic random access memory (DRAM).

14. The mask according to claim 3, wherein the array of apertures comprises a first row and a second row, wherein the apertures in alternating rows and columns are staggered, wherein a third row resides between the first and second row, wherein at least one of the assist lines is disposed between two adjacent apertures in the third row.

15. The mask according to claim 9, wherein the array of apertures comprises a first row and second row, wherein apertures in alternating rows and columns are staggered, wherein a third ow resides between the first and second row, wherein at least one of the assist lines is disposed between two adjacent apertures in the third row.

\* \* \* \* \*

UNITED STATES PATENT AND TRADEMARK OFFICE
CERTIFICATE OF CORRECTION

PATENT NO. : 6,670,646 B2
DATED : December 30, 2003
INVENTOR(S) : Lu et al.

It is certified that error appears in the above-identified patent and that said Letters Patent is hereby corrected as shown below:

<u>Column 6,</u>
Line 19, replace "wit" with -- with --.

<u>Column 8,</u>
Line 6, replace "apertures" with -- aperture --;
Line 29, replace "compnises" with -- comprises --;
Line 45, replace "nm width" with -- nm in width --; and
Line 63, replace "third ow" with -- third row --.

Signed and Sealed this

Twenty-fourth Day of February, 2004

JON W. DUDAS
*Acting Director of the United States Patent and Trademark Office*